United States Patent [19]

Limm et al.

[11] 4,331,938
[45] May 25, 1982

[54] INJECTION LASER DIODE ARRAY HAVING HIGH CONDUCTIVITY REGIONS IN THE SUBSTRATE

[75] Inventors: Albert C. Limm, Lancaster; James T. O'Brien; Thomas V. Colgrove, both of Leola; Paul Nyul, New Holland, all of Pa.

[73] Assignee: RCA Corporation, New York, N.Y.

[21] Appl. No.: 180,898

[22] Filed: Aug. 25, 1980

[51] Int. Cl.³ ............................................... H01S 3/19
[52] U.S. Cl. ...................................... 372/50; 372/46; 357/17
[58] Field of Search ............... 331/94.5 H; 357/17,18, 357/45

[56] References Cited

U.S. PATENT DOCUMENTS

| | | | |
|---|---|---|---|
| 3,340,479 | 9/1967 | Ashkin | 331/94.5 H |
| 3,471,923 | 10/1969 | Lamorte et al. | 29/572 |
| 3,747,016 | 7/1973 | Kressel et al. | 331/94.5 H |
| 3,753,801 | 8/1973 | Lockwood et al. | 148/171 |
| 3,936,322 | 2/1976 | Blum et al. | 331/94.5 H |
| 4,092,659 | 5/1978 | Ettenberg | 357/18 |
| 4,127,792 | 11/1978 | Nakata | 313/500 |
| 4,149,175 | 4/1979 | Inoue et al. | 331/94.5 H |

OTHER PUBLICATIONS

Cannuli, "Formation of Internally-Confined Semiconductor Lasers" *NASA Tech Brief*, Dec. 1975, B75-10299.
Blum et al., "Double Heterojunction Laser Arrays", *IBM Technical Disclosure Bulletin*, vol. 15, No. 7, Dec. 1972, p. 2345.
Dumke et al., "Room Temperature Laser Array with Buried Diffused Stripes", *IBM Technical Disclosure Bulletin*, vol. 16, No. 6, Nov. 1973, p. 1758.
Burnham et al., "Striped-Substrate Double-Heterostructure Lasers", IEEE Journal of Quantum Electronics, vol. QE-11, No. 7, Jul. 1975, pp. 418-420.

*Primary Examiner*—James W. Davie
*Attorney, Agent, or Firm*—Birgit E. Morris; William J. Burke

[57] ABSTRACT

An improved semiconductor injection laser diode array having reduced interaction between the elements of the array. The array comprises a substrate, an active layer and a capping layer with a separate electrical contact to the capping layer for each element of the array and a common electrical contact to the substrate. The reduced interaction is obtained by regions of higher electrical conductivity extending through the substrate towards the p-n junction from those portions of the substrate surface opposed to the contacts to the capping layer and by separate electrical contacts to each of these higher conductivity regions. The higher conductivity regions provide a lower resistivity path for current flowing through the p-n junction, thus reducing current spreading.

5 Claims, 3 Drawing Figures

INJECTION LASER DIODE ARRAY HAVING HIGH CONDUCTIVITY REGIONS IN THE SUBSTRATE

The invention is an improved semiconductor injection laser diode array where all the elements of the array are contained on a single substrate and have a reduced interaction with one another.

BACKGROUND OF THE INVENTION

A semiconductor injection laser diode is a body of single crystalline semiconductor material having regions of opposite conductivity type thereby forming a p-n junction. When the diode is properly electrically biased, light is emitted by recombination of oppositely charged carriers in the p-n junction region. Since these laser diodes are low output power devices, arrays of diodes have been connected together to increase the output power. To provide and maintain good optical alignment of the elements of the array with one another and to minimize the assembly required, arrays have been fabricated so that the elements are on a single substrate.

A problem with such arrays is maintaining the relative electrical isolation between the different elements of the array. Lamorte et al, U.S. Pat. No. 3,471,923 issued Dec. 9, 1966, have disclosed an array of laser diodes on a single substrate where the electrical isolation is obtained by cutting slots through the semiconductor body down to the substrate layer. A separate electrical contact is then made to each diode on the side separated by the slots and a common electrical contact is made to the other side of the substrate. This approach has the undesirable feature of requiring the additional step of cutting the slots after the fabrication of the array has been completed, thus increasing cost and decreasing reliability.

SUMMARY OF THE INVENTION

An edge emitting array of semiconductor injection laser diodes comprises a substrate with an active layer overlying a major surface of the substrate and a cap layer overlying the active layer. The substrate is of one conductivity type and the active layer and the cap layer are of an opposite conductivity type, thereby forming a p-n junction between the substrate and the active layer. Each element of the array has a separate electrical contact to the cap layer and a common electrical conductor contacts the opposed major surface of the substrate. The improvement comprises regions of higher conductivity than that of the substrate extending a distance into the substrate towards the p-n junction from those portions of the major surface of the substrate opposed to the contacts to the cap layer and an electrically conducting layer overlying only those portions of the major surface from which the higher conductivity regions extend into the substrate. The higher conductivity regions provide a lower resistivity path to the substrate contact for electrical current passing across the p-n junction thereby reducing the spreading of electrical current from one element of the array to the neighboring elements and thus reducing the interaction with neighboring elements.

DETAILED DESCRIPTION OF THE INVENTION

Figure 1:
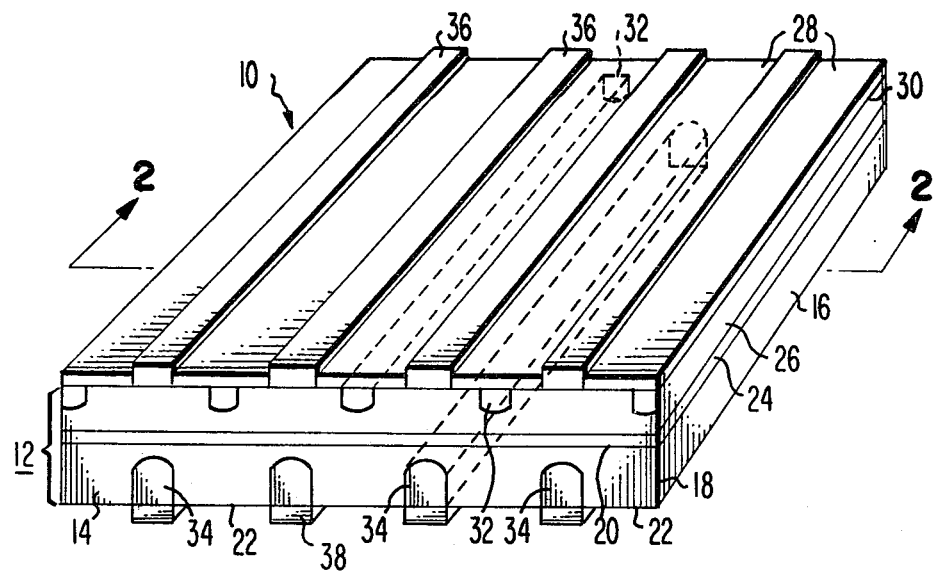
FIG. 1 is a schematic illustration of a perspective view of a semiconductor injection laser diode array incorporating the invention.
Figure 2:
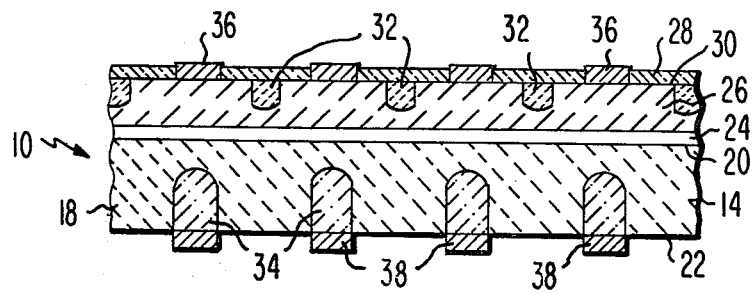
FIG. 2 is a schematic illustration of a cross-sectional view of the semiconductor injection laser diode array along the line 2—2 of FIG. 1.

Referring to FIGS. 1 and 2, an injection laser array 10 comprises a body 12 of single crystalline semiconductor material, generally of the group III-V compounds or alloys of such compounds, which has spaced parallel end surfaces 14 which are reflecting to light at the wavelength of the light output of the laser array with at least one of the end surfaces being partially transparent so that light may be emitted therefrom. The body 12 also includes spaced substantially parallel side surfaces 16 which extend between and are perpendicular to the end surfaces 14.

The body 12 is formed by a substrate 18 having spaced, parallel top and bottom surfaces 20 and 22, respectively, which extend between and are perpendicular to both the end surfaces 14 and the side surfaces 16 of the body 12. An active layer 24 of a material having a conductivity type opposed to that of the substrate 18 overlies the surface 20 of the substrate 18 thereby forming a p-n junction at the interface between the substrate 18 and the active layer 24. A cap layer 26 of the same conductivity type as the active layer 24 overlies the active layer 24. An electrically insulating layer 28 overlies the surface 30 of the cap layer 26 and has openings therethrough which extend down to the surface 30 of the cap layer 26 and extend between the end surfaces 14 thereby forming stripes in the electrically insulating layer 28 wherein the surface 30 of the cap layer 26 is exposed. Typically, there is one such stripe per diode of the array. Guard channels 32 of the same conductivity type as the substrate 18 may extend from the surface 30 a distance into the cap layer 26 towards the active layer 24. These guard channels 32, which are positioned between the stripes in the electrically insulating layer and underlie the insulating layer, extend from the front to the rear end faces. High conductivity regions 34, of the same conductivity type as the substrate 18 but having a higher conductivity than the substrate 18, extend a distance into the substrate from those portions of the bottom surface 22 opposed to the openings in the electrically insulating layer 28 towards the p-n junction but do not reach the junction region itself.

Separate electrical contacts 36 provide electrical contact to the surface 30 of the cap layer 26 at each opening in the electrically insulating layer 28. Separate substrate electrical contacts 38 provide electrical contact to the lower major surface 22 of the substrate 18 in the areas of the surface 22 opposite to each of the cap electrical contacts 34 and overlie those regions of the surface 22 from which the high conductivity regions 34 extend into the substrate 18. Each diode of the array then has separate electrical contacts on opposite major surfaces of the substrate 18.

Figure 3:
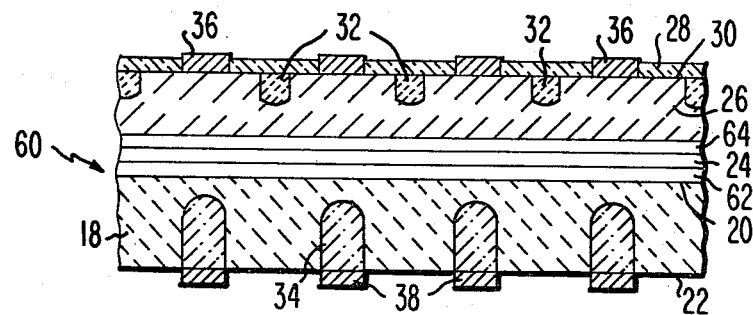
FIG. 3 is a schematic illustration of a cross-sectional view of a second embodiment of the invention.

Referring to FIG. 3, the numerical identification of the elements common to the array 60 and the array 10 of FIG. 1 is the same. The array 60 differs from the array of FIG. 1 in that a lower confining layer 62, of the same conductivity type as the substrate 18, is interposed between the substrate 18 and the active layer 24 and an upper confining layer 64, of the same conductivity type as the cap layer 26 and the active layer 24, is interposed between the active layer 24 and the cap layer 26. A p-n junction is then formed at the interface between the active layer 24 and the lower confining layer 62.

The substrate 18 is typically selected from those known III-V group compounds which form good substrate materials and may be a binary, ternary or quaternary compound. The substrate should also be such that the layers deposited on it can attain an approximate lattice match to the substrate. Preferably, the substrate is gallium arsenide having n-type conductivity. The typical n-type dopant is silicon in a concentration range from about 2 to about $3.5 \times 10^8$ silicon ions per cubic centimeter. The resistivity of the substrate is typically between about 0.0001 and 0.0007 ohm-cm.

The active layer 24 is the of opposite conductivity type to the substrate 18 and may be formed by epitaxial growth or by diffusion of an appropriate dopant into the surface 20 of the substrate. If the substrate 18 is n-type gallium arsenide, the active layer 24 may be p-type gallium arsenide. The preferred p-type dopant is zinc which can be added to the epitaxial layer during growth or diffused into the substrate using well known techniques. The p-n junction in then formed at the growth interface or by the diffusion boundary within the substrate layer respectively. The epitaxial layer may be deposited using deposition apparatus and techniques such as disclosed by Lockwood et al in U.S. Pat. No. 3,753,801, issued Aug. 21, 1973.

The cap layer 26 is of the same conductivity type as the active layer 24, is typically p-type gallium arsenide doped with zinc to a level of about $10^{19}$–$10^{20}$ zinc ions per cubic centimeter and is about 10 to 20 micrometers thick.

The guard channels 32 serve to block electrical current flow along the surface 30 between neighboring elements of the array. These channels may be formed by diffusion of a suitable dopant into the cap layer so as to form regions of a conductivity type opposite to that of the cap layer 24. If the cap layer 24 is p-type gallium arsenide, tin is a useful dopant.

The electrically insulating layer 28 may be composed of any material which provides a continuous layer and bonds well to the cap layer. Preferably, the electrically insulating layer is composed of silicon dioxide deposited to a thickness of about 100 nanometers by pyrolytically decomposing a gas containing silicon, such as silane, in oxygen or water vapor.

The openings in the insulating layer 28 are formed using photoresist technology well known in the art. A photoresist layer overlying the electrically insulating layer is exposed to a pattern of light in the form of the openings desired. The exposed photoresist is developed to form openings and the underlying electrically insulating layer under the openings is then removed using suitable etchants.

Electrical contacts 36 may be made to the cap layer 26 in the openings in the electrically insulating layer 28 by electroless deposition techniques. Sequential electroless deposition of nickel and gold provides a useful contact. To maintain electrical isolation between the elements of the array the deposition pattern is such that overlap of the metallization between adjacent openings in the electrically insulating layer does not occur.

The conductivity of the higher conductivity regions 34 is of the same type but is substantially higher than that of the substrate 18. These regions 34 provide a high conductivity path for current passing across the p-n junction. In effect, these regions provide an electrically shortened path across the substrate to within a close proximity of the p-n junction, thereby reducing the current spreading and thus the interaction with the neighboring elements of the array by reducing the electrical resistance between the contacts 34 and 36 of an element of the array. If the substrate 18 is of n-type conductivity, an n-type dopant such as tin can be diffused into the substrate through openings in a masking layer formed using a standard photolithographic technique. The conductivity of the regions 34 varies with distance into the substrate because of the concentration profile of the diffused dopant, being largest at the substrate surface and decreasing with increasing distance into the substrate from the surface.

A separate electrical contact 38 is made to each of the regions of higher conductivity 34 by depositing a metal film on those areas of the major surface 22 from which the highly conducting regions extend. This contact is preferably comprised of metals which form an ohmic contact to the surface 22. A useful contact can be formed by evaporation of tin followed by electroless deposition of nickel and gold.

The lower and upper confining layers 62 and 64 of FIG. 3 provide optical confinement in the direction perpendicular to the plane of the active layer 24 for light propagating in the active layer. A semiconductor injection laser having such layers has been disclosed by Kressel et al in U.S. Pat. No. 3,747,016 issued July 17, 1973 and incorporated herein by reference. This is done by providing as the lower and upper confining layers 62 and 64 materials which have an index of refraction at the lasing wavelength which is less than that of the active layer 24. For an active layer of p-type gallium arsenide and a substrate of n-type gallium arsenide, a suitable material for the lower confining layer is n-type aluminum $Al_xGa_{1-x}As$ and a suitable material for the upper confining layer is p-type $Al_yGa_{1-y}As$ where x and y are the fractional concentration of aluminum in the lower and upper confining layers respectively and are typically equal to about 0.1 to 0.3. Preferably x and y are equal in order to provide a spatially symmetric output beam from the laser. The active layer 24 may also contain aluminum added intentionally during the growth of this layer or by diffusion from the confining layers during the growth of these layers. However, in order to maintain the confining effect, the aluminum concentration of the active layer must be less than that in the lower and upper confining layers.

One of the opposed end faces 14 of the array is typically coated with a layer of aluminum oxide or a similar material having a thickness of about one half wave at the lasing wavelength. The opposed end face may be coated with a light reflector which is reflecting at the lasing wavelength. This light reflector may consist of a layer of an electrical insulator such as silicon dioxide coated with a layer of gold or, alternatively, the light reflector may be a multi-layer reflector such as that disclosed by Ettenberg in U.S. Pat. No. 4,092,659 issued May 30, 1978.

We claim:

1. In an edge emitting semiconductor injection laser diode array having multiple light emitting regions which comprises: a substrate of semiconductor material having two major opposed surfaces and two opposed end surfaces, at least one of which is partially transmissive to light; an active layer overlying the substrate; a cap layer overlying the active layer; an electrically insulating layer overlying the cap layer and having multiple openings therethrough whereby the cap layer is exposed; electrically conducting layers overlying the cap layer in the region of the openings in the electrically insulating layer whereby separate electrical contact is made to the cap layer in each light emitting region; and an electrically conducting layer overlying the opposed major surface of the substrate;

the improvement which comprises regions of the same conductivity type as the substrate and of higher conductivity than the substrate which extend from those portions of the second major surface of the substrate opposed to the openings in the electrically insulating layer a distance into the substrate towards the p-n junction; and electrically conducting layers overlying those portions of the second major surface from which the regions of higher conductivity extend into the body whereby separate electrical contact is made to each of the regions of higher conductivity.

2. A semiconductor injection laser diode array according to claim 1 having guard channels of a conductivity type opposed to that of the cap layer, underlying a portion of the electrically insulating layer and extending from the interface between the electrically insulating layer and the cap layer a distance towards the p-n junction.

3. A semiconductor injection laser diode array according to claim 1 wherein the substrate is n-type gallium arsenide and the active layer and the cap layer are both p-type gallium arsenide.

4. A semiconductor injection laser diode array according to claim 3 wherein a layer of n-type aluminum gallium arsenide is interposed between the substrate and the active layer and a layer of p-type aluminum gallium arsenide is interposed between the active layer and the cap layer whereby a p-n junction is formed between the active layer and the n-type aluminum gallium arsenide layer.

5. A semiconductor injection laser diode array according to claim 1 wherein a light reflector overlies one of the opposed end surfaces whereby the light emitted from said surface is reflected from the light reflector back back into the semiconductor device.

* * * * *